(12) United States Patent
Milshtein

(10) Patent No.: US 8,628,617 B2
(45) Date of Patent: Jan. 14, 2014

(54) SYSTEM AND METHOD FOR TOP-DOWN MATERIAL DEPOSITION

(75) Inventor: Erel Milshtein, Cupertino, CA (US)

(73) Assignee: First Solar, Inc., Perrysburg, OH (US)

( * ) Notice: Subject to any disclaimer, the term of this patent is extended or adjusted under 35 U.S.C. 154(b) by 557 days.

(21) Appl. No.: 12/623,367

(22) Filed: Nov. 20, 2009

(65) Prior Publication Data

US 2010/0210059 A1 Aug. 19, 2010

Related U.S. Application Data

(60) Provisional application No. 61/119,610, filed on Dec. 3, 2008.

(51) Int. Cl.
*C23C 16/00* (2006.01)
*C23C 16/455* (2006.01)

(52) U.S. Cl.
USPC ..... 118/715; 118/720; 118/729; 118/723 VE; 118/723 EB

(58) Field of Classification Search
USPC ........... 118/715, 719, 720, 726, 729, 723 VE, 118/723 EB
See application file for complete search history.

(56) References Cited

U.S. PATENT DOCUMENTS

| | | | |
|---|---|---|---|
| 3,970,820 A | 7/1976 | Mahl | |
| 4,401,052 A | 8/1983 | Baron et al. | |
| 4,526,840 A | 7/1985 | Jerabek | |
| 5,182,567 A | 1/1993 | Wilder | |
| 5,216,742 A | 6/1993 | Krug et al. | |
| 5,534,314 A | 7/1996 | Wadley et al. | |
| 5,945,163 A | 8/1999 | Powell et al. | |
| 6,037,241 A | 3/2000 | Powell et al. | |
| 6,058,740 A | 5/2000 | McMaster et al. | |
| 6,206,976 B1* | 3/2001 | Crevasse et al. | 118/720 |
| 6,338,775 B1* | 1/2002 | Chen | 204/192.11 |
| 6,367,414 B2 | 4/2002 | Witzman et al. | |
| 6,562,405 B2 | 5/2003 | Eser et al. | |
| 7,194,197 B1 | 3/2007 | Wendt et al. | |
| 7,780,787 B2 | 8/2010 | Nolan | |
| 2003/0041801 A1 | 3/2003 | Hehmann | |
| 2005/0183670 A1* | 8/2005 | Grantham et al. | 118/726 |
| 2005/0249873 A1* | 11/2005 | Sarigiannis et al. | 427/248.1 |
| 2006/0019030 A1* | 1/2006 | Lipson et al. | 427/248.1 |
| 2006/0177572 A1* | 8/2006 | Smith et al. | 427/180 |
| 2007/0207266 A1* | 9/2007 | Lemke | 427/212 |
| 2007/0248753 A1* | 10/2007 | Tyan et al. | 427/248.1 |
| 2008/0044571 A1 | 2/2008 | Maltby | |
| 2008/0057195 A1* | 3/2008 | Schlichting | 427/248.1 |
| 2009/0110847 A1* | 4/2009 | Amelung | 427/569 |
| 2009/0246940 A1 | 10/2009 | Powell | |
| 2010/0047474 A1* | 2/2010 | Neal et al. | 427/585 |
| 2010/0189929 A1* | 7/2010 | Neal et al. | 427/585 |
| 2010/0210059 A1* | 8/2010 | Milshtein | 438/57 |

(Continued)

FOREIGN PATENT DOCUMENTS

WO WO2006/116411 11/2006

*Primary Examiner* — Mary Wilczewski
(74) *Attorney, Agent, or Firm* — Dickstein Shapiro LLP

(57) ABSTRACT

A method and apparatus for depositing a film on a substrate includes introducing a vaporizable material from a source positioned above a substrate. The vaporizable material is vaporized and directed as an vapor feed stream from the source, away from the substrate. The vapor feed stream is redirected as a plume from a redirector, towards the substrate and deposited as a film on the substrate.

79 Claims, 5 Drawing Sheets

(56) References Cited

U.S. PATENT DOCUMENTS

2010/0247809 A1* 9/2010 Neal .............................. 427/596
2011/0039401 A1 2/2011 Nolan
2013/0186338 A1* 7/2013 Tsai et al. ..................... 118/725

* cited by examiner

SYSTEM AND METHOD FOR TOP-DOWN MATERIAL DEPOSITION

CLAIM OF PRIORITY

This application claims priority to U.S. Provisional Patent Application No. 61/119,610, filed on Dec. 3, 2008, which is incorporated by reference in its entirety.

TECHNICAL FIELD

The present invention relates to photovoltaic device production.

BACKGROUND

In the manufacture of a photovoltaic device, semiconductor material is deposited on a substrate. This may be accomplished by vaporizing the semiconductor and directing the vaporized semiconductor towards the substrate surface, such that the vaporized semiconductor condenses and is deposited on the substrate, forming a solid semiconductor film.

SUMMARY

A material deposition system can include a source of a vapor feed stream, a vapor supply orifice directed toward a substrate position, and a redirector configured to direct the vapor feed stream toward the vapor supply orifice. The distributor assembly can include a lower redirector positioned to isolate the vapor feed stream from the substrate position, and a chamber wall containing the source and the redirector.

The redirector can include an asymmetrical cross-section, such that the vapor feed stream is directed away from the source. The redirector can include an electrical connection proximate to the source, such that the vapor feed stream is directed away from the electrical connection. One or more observation apertures can be formed in the redirector for use in observing the system, such as in low-rate flux measurement. The system can be observed using electronic instrumentation. The electronic instrumentation can include any known instrumentation, including electron impact emission spectroscopy instrumentation and quartz crystal microbalance instrumentation.

The source can be a vapor boat. The source can be rectangular or cylindrical. There can be multiple sources, and they can be aligned to direct respective vapor feed streams toward the redirector. The multiple sources can be independently controllable and can be independently configured for improved uniformity control of the deposition process. A second source can be a distance from the vapor supply orifice unequal to the distance between the first source and the vapor supply orifice. Where the material deposition system includes a redirector and a lower redirector, the second source of vapor feed stream can be positioned a distance from a nozzle formed by the redirector and the lower redirector that is different from the distance between the source of vapor feed stream and the nozzle. The second source of vapor feed stream can be positioned below the source of vapor feed stream, such that the system can provide multiple depositions on a substrate.

The source can contain a vaporizable material, which can include a liquid or a solid. The material deposition system can include an electron-beam source to electron-beam evaporate the vaporizable material, or a heater to thermal evaporate the vaporizable material. The source can be connected to a continuous feed source, such as a wire feed. The redirector can be curved and can include a plurality of planar sections. The redirector can shape the vapor feed stream into one or more vapor plumes, each having a central angle, which can expand in the direction of the substrate position. The central angle can be approximately perpendicular to the substrate position.

The redirector can be heated. It can be heated directly or indirectly. The redirector can include metal or a ceramic, such as silicon carbide, pyrolytic boron nitride, graphite, and pyrolytic boron nitride-coated graphite. The redirector can be segmented across its width, and can include ribs to define these segments.

A system for depositing film on a substrate includes a material deposition system including a vapor feed stream source positioned above a substrate position and which directs a vapor feed stream away from the substrate position and a redirector configured to direct the vapor feed stream toward the substrate position. The material a film on a substrate also includes a conveyor for transporting a substrate into the substrate position sufficiently proximate to the distributor assembly such that the vapor feed stream may be deposited on the substrate as a film. The system for depositing film on a substrate can include a lower redirector positioned to isolate the vapor feed stream from the substrate position and toward the redirector, and a chamber wall containing the source and the redirector. The source can be a vapor boat. The source can be rectangular or cylindrical. There can be multiple sources and they can be aligned to direct respective vapor feed stream away from the substrate position and toward the redirector. The source can contain a vaporizable material, which can include a liquid or a solid.

The distributor assembly can include an electron-beam source to electron-beam evaporate the vaporizable material, or a heater to thermal evaporate the vaporizable material. The source can be connected to a continuous feed source, such as a wire feed. The redirector can be curved and can include a plurality of planar sections. The redirector can shape the vapor feed stream into one or more vapor plumes, each having a central angle, which can expand in the direction of the substrate position. The central angle can be approximately perpendicular to the substrate position.

The redirector can be heated. It can be heated directly or indirectly. The redirector can include metal or a ceramic, such as silicon carbide, pyrolytic boron nitride, graphite, and pyrolytic boron nitride-coated graphite. The redirector can be segmented across its width, and can include ribs to define these segments.

A method for depositing a material on a substrate includes transporting a substrate into a substrate position, vaporizing at least a portion of a vaporizable material into a vapor, directing the vapor from a vapor feed stream source as a vapor feed stream, away from the substrate and toward a redirector, and redirecting a portion of the vapor feed stream from the redirector as a vapor plume, toward the substrate such that the material in the vapor plume is deposited as a film on the substrate. The step of directing the vapor from the source can include directing the vapor into a space between the redirector and a lower redirector. The film can include, for example, copper indium gallium selenide or cadmium telluride.

The method can include the step of heating the redirector, directly or indirectly. The step of vaporizing the material can include, for example, electron-beam evaporating the material or thermal evaporating the material. The step of redirecting the vapor feed stream from the redirector as a vapor plume can include directing the vapor plume at a central angle substantially perpendicular to the substrate. The step of redirecting the vapor feed stream from the redirector as a vapor plume can include directing the vapor plume toward the substrate across substantially the entire width of the substrate. The method can further include the step of expanding the vapor plume in the direction of the substrate. The step of expanding the vapor plume in the direction of the substrate can include expanding the plume to cover substantially the entire length of the substrate. The step of introducing a vaporizable material into a source can include continuously feeding the material into the source. The method can further include the step of redirecting a second portion of the vapor feed stream from the redirector as a second vapor plume, toward the substrate such that the material in the vapor plume is deposited as a film on the substrate. The method can include the further step of measuring the vapor feed stream.

DETAILED DESCRIPTION

An apparatus and method for depositing a semiconductor film on a glass substrate are described, for example, in U.S. Pat. Nos. 3,970,820, 4,401,052, 4,526,840, 5,182,567, 6,037,241, 6,367,414, 6,562,405 and 5,216,742, the disclosures of which are herein incorporated by reference in their entirety.

A vaporizable material such as a solid semiconductor powder can be introduced into a vapor feed stream source. The vapor feed stream source can be a container into which the vaporizable material is introduced and vaporized to form a vapor feed stream. The source can be mounted in a film deposition chamber, above a substrate position. The feed stream is directed through an opening in the container, away from a substrate located at the substrate position below. The feed stream is then redirected as a plume by a redirector adjacent to the opening, toward the substrate. The material is deposited on the substrate as a film.

Figure 1:
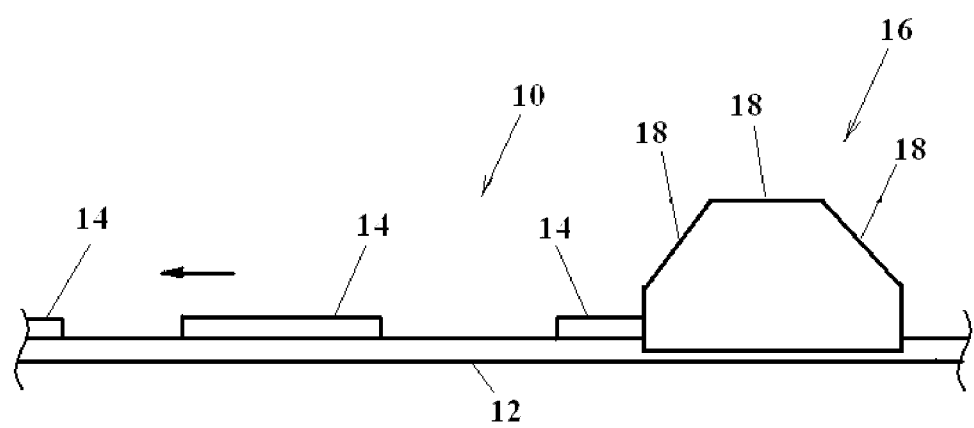
FIG. 1 is a drawing depicting a portion of a substrate processing system.

With reference to FIG. 1 of the drawings, a substrate processing system 10 includes conveyor 12 which conveys substrates 14 along the conveyor 12 and through film deposition chamber 16. Film deposition chamber 16 is enclosed by film deposition chamber walls 18. Substrate 14 can be a glass substrate and can include soda-lime glass. Substrate 14 can be coated with a material.

Figure 2:
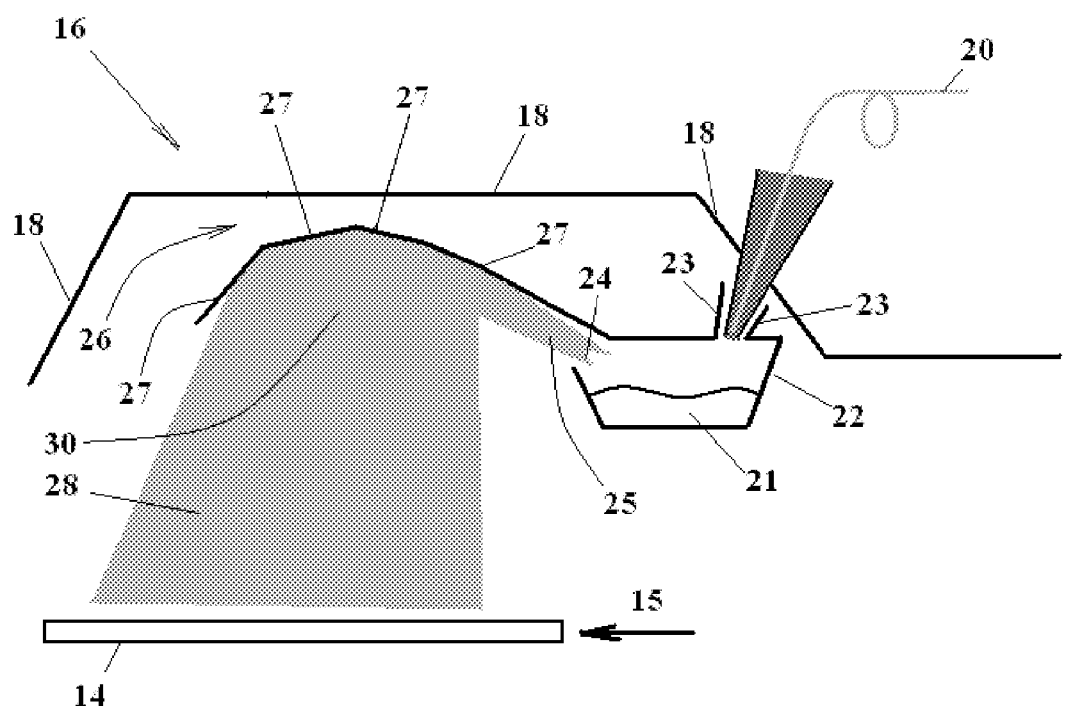
FIG. 2 is a drawing depicting a cross-sectional view of an embodiment of a film deposition chamber.

Referring to FIG. 2, a cross-section view of film deposition chamber 16 and the distributor assembly contained within chamber walls 18 is depicted. Substrate 14 can be provided at a substrate position within film deposition chamber 16 and can be stationary at the substrate position or can travel continuously through the substrate position in a direction of travel 15. Feed wire 20 introduces vaporizable material 21 into vapor feed stream source 22, which can be a container mounted within film deposition chamber 16 and above substrate 14. Vaporizable material 21 can also be introduced into vapor feed stream source 22 by any other known suitable manner, and can be introduced in a continuous or batch manner. Vaporizable material 21 can be a liquid or a solid. Vaporizable material 21 can be a semiconductor powder, such as copper indium gallium selenide (CIGS) or cadmium telluride (CdTe). Vaporizable material 21 is then vaporized. Vaporizable material 21 can be vaporized by electron beam evaporation (e-beam evaporation) using an electron gun. Vaporizable material 21 can also be vaporized by thermal evaporation. Thermal evaporation can be carried out using heaters 23 proximate to vapor feed stream source 22. Heaters 23 can be positioned adjacent to the walls of vapor feed stream source 22. Heaters 23 can also be positioned adjacent to feed wire 20 as it introduces vaporizable material 21 into vapor feed stream source 22. Heaters 23 heat vaporizable material 21 to a temperature sufficient to vaporize at least a portion of vaporizable material 21.

In continuing reference to FIG. 2, vaporizable material 21, when it is vaporized, is directed from vapor feed stream source 22. Vapor feed stream source 22 can be a container including an opening 24 through which vapor feed stream 25 is directed. Vapor feed stream 25 is directed generally away from substrate 14 below. Vapor feed stream 25 is directed toward redirector 26. Redirector 26 redirects vapor feed stream 25 by redirecting, deflecting, and/or reflecting vapor feed stream 25 such that the mass of vapor feed stream 25 is transferred or transitioned in a different direction or to a different location within film deposition chamber 16. Redirector 26 is positioned above substrate 14 and at least in part above opening 24. Redirector 26 can be connected to vapor feed stream source 22 and defines a space within film deposition chamber 16 where vapor feed stream 25 is directed. Redirector 26 can have a curved form, which is concave to define the space within film deposition chamber 16 where vapor feed stream 25 is directed. Redirector 26 can also include planar redirector sections 27 to define a concave space within film deposition chamber 16 where vapor feed stream 25 is directed. Vapor feed stream 25 can be incident upon a first position on redirector 26 at a first angle. Redirector 26 can be configured to redirect vapor feed stream 25 at a second angle toward substrate 14, or toward a second position on redirector 26. If vapor feed stream 25 is redirected toward a second position on redirector 26, it can then be redirected at a third angle. Eventually, vapor feed stream 25 is redirected at a last angle towards substrate 14. By configuring redirector 26 to create a path of angles for vapor feed stream 25, vapor feed stream 25 can be directed toward a substrate with increased control and precision.

The redirection of vapor feed stream 25 caused by redirector 26 can be designed by providing an appropriate curvature (in the case of a curved redirector 26) or by providing a combination of appropriately sized planar redirector sections 27 joined at appropriate angles. Redirector 26 can be asymmetrical on each axis located between the ends of redirector 26 and aligned perpendicular to the direction of transport of substrate 14. Redirector 26 can have multiple planar redirector sections 27, where no two planar redirector sections 27 have the same dimensions. For example, redirector 26 having planar redirectors 27 each with a unique length along the direction of transport of substrate 14 will be asymmetrical. Redirector 26 can also be asymmetrical, even if it includes multiple planar redirector sections 27 of the same dimension. For example, redirector 26 including four planar redirector sections 27 will be asymmetrical if the first and second planar redirector sections 27 have the same first length, third planar redirector section 27 has a different second length and fourth planar redirector section 27 has a third length different from the first and second lengths.

Redirector 26 can also be asymmetrically configured by varying the angle of incidence of one planar redirector section 27 to the next. Where redirector 26 includes three or more planar redirector sections 27, and no two angles between planar redirector sections 27 are the same, redirector 26 will be asymmetrical. Redirector 26 can also be asymmetrical even if it includes multiple planar redirector sections 27 of the same angle of incidence. For example, redirector 26 including four planar redirector sections 27 will be asymmetrical (regardless of the size of planar redirector sections 27) if the angle of incidence between the first planar redirector section 27 and the second planar redirector section is the same as the angle of incidence between the second planar redirector section 27 and the third planar redirector section 27, if the angle of incidence between the third planar redirector section 27 and fourth planar redirector section 27 is different from the other common angles of incidence.

Using various size planar redirector sections 27 having various angles of incidence between them provides great flexibility in the design of redirector 26 and allows a high degree of ability to control angles at which vapor feed stream 25 is redirected. Redirector 26 can thus direct vapor feed stream 25 away from vapor feed stream source 22. And, the flexibility of redirector 26 additionally allows vapor feed stream 25 to be redirected at a precise angle towards a precise position on a substrate 14.

A material deposition system contained in film deposition chamber 16 can include an electrical connection proximate to vapor feed stream source 22. Therefore, redirector 26 can direct vapor feed stream 25 away from both vapor feed stream source 22 and proximate electrical connections. Redirector 26 can include metal. Redirector 26 can include ceramic, such as silicon carbide, pyrolytic boron nitride, graphite, or pyrolytic boron nitride-coated graphite. Redirector 26 can be heated, directly or indirectly, to maintain vapor feed stream 25 in vapor form and prevent it from being deposited on the surface of redirector 26.

Redirector 26 shown in FIG. 2 can include one or more observation apertures formed in the surface of redirector 26. The observation apertures can be of any suitable size, shape or position to observe any aspect of the film deposition process which an observer wants to measure. Examples of such measurements include low-rate flux measurement and measurements using electronic instrumentation, such as electron impact emission spectroscopy (EIES) and quartz crystal microbalance (QCM) instrumentation. Instrumentation can be positioned proximate to, adjacent to, or within observation apertures formed in the surface of redirector 26. Vapor feed stream 25 can be observed visually, as with an optical window. In response to observations taken, variables such as the rate of feed of vaporizable material 21, the temperature of heaters 23 and vapor feed stream source 22 and the velocity of substrate 14 along direction of travel 15 can be modulated.

In further reference to FIG. 2, redirector 26 redirects vapor feed stream 25 downward through vapor supply orifice 30 toward an exposed surface of substrate 14. Redirector 26 can also reshape vapor feed stream 25 into an vapor plume 28 which expands from narrower to wider as it travels through vapor supply orifice 30 in the direction of substrate 14. Vapor plume 28 can expand to a wide plume which can cover substantially the entire length of substrate 14 in the direction of travel 15. Vapor plume 28 can have a central angle characterized by the line defined by two points: a first point midway between the boundaries of vapor feed stream 25 where vapor feed stream 25 meets redirector 26, and a second point midway between the boundaries of vapor plume 28 where vapor plume 28 meets the plane containing substrate 14. The central angle can be substantially perpendicular to substrate 14. In another aspect, one or more vapor feed streams 25 can be redirected and shaped into multiple vapor plumes 28 directed to different positions on the substrate. When vapor plume 28 contacts substrate 14, it forms a film on a surface of substrate 14.

Figure 3:
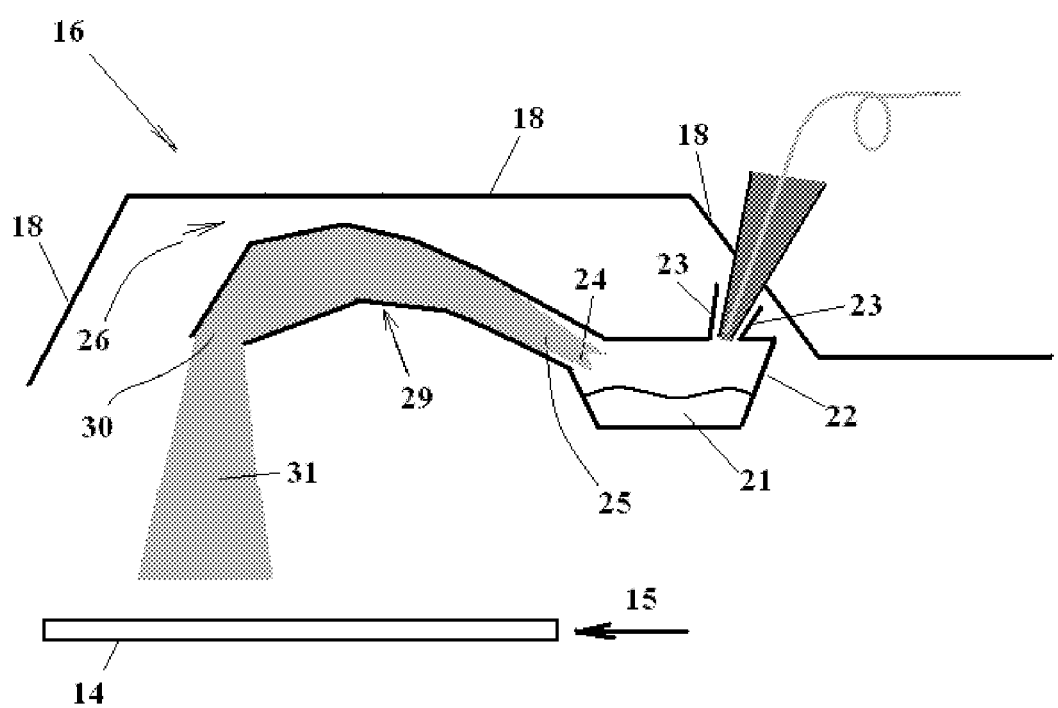
FIG. 3 is a drawing depicting a cross-sectional view of an additional embodiment of a film deposition chamber.

Referring to FIG. 3, a cross-section of another embodiment of a film deposition chamber 16 and the distributor assembly contained within chamber walls 18 is depicted. Like FIG. 2, FIG. 3 shows a vaporizable material 21, contained in vapor feed stream source 22 and heaters 23 to vaporize vaporizable material 21. Vapor feed stream source 22 can have opening 24 through which vaporizable material 21 is directed as vapor feed stream 25, after it is vaporized. As shown in FIG. 2, vapor feed stream 25 is directed into a space defined in part by redirector 26. As shown in FIG. 3, this space can also be defined by a lower redirector 29. Lower redirector 29, like redirector 26, is positioned above substrate 14. Lower redirector 29 can be positioned in part above opening 24. Lower redirector 29 can be connected to portion of opening 24 opposite the portion of opening 24 that redirector 26 is connected to. Along with redirector 26, lower redirector 29 defines a space within film deposition chamber 16 where vapor feed stream 25 is directed. Lower redirector 29 can have a curved form, which can be substantially convex to the space occupied by vapor feed stream 25, such that lower redirector 29 can "nest" partially within the concave shape of redirector 26. Lower redirector 29 can also include planar redirector sections to define the convex boundary of the space within film deposition chamber 16 where vapor feed stream 25 is directed. Lower redirector 29 can be asymmetrical to an axis taken along a line perpendicular to substrate 14. Lower redirector 29 can include metal. Lower redirector 29 can include ceramic, such as silicon carbide, pyrolytic boron nitride, graphite, or pyrolytic boron nitride-coated graphite. Lower redirector 29 can be heated, directly or indirectly, to maintain vapor feed stream 25 in vapor form and prevent it from being deposited on the surface of lower redirector 29.

Lower redirector 29 can be positioned relative to redirector 26 in such a manner to form vapor supply orifice 30. Vapor supply orifice 30 can have a nozzle-shaped cross section which can redirect and reshape vapor feed stream 25 as vapor plume 31. As shown in FIG. 3, vapor supply orifice 30 can be formed by redirector 26 and lower redirector 29 such that vapor plume 31 is narrower than vapor plume 28 depicted in FIG. 2, and expansion of vapor plume 31 can be more precisely controlled and limited as vapor plume 31 travels in the direction of substrate 14. As a result, narrower vapor plume 31 can be calibrated to deposit a film on a smaller portion of the surface of substrate 14.

Figure 4:
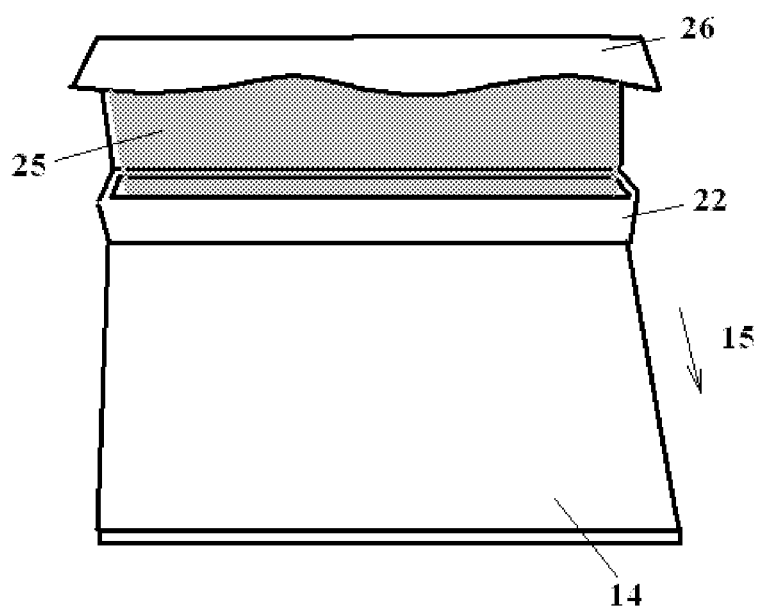
FIG. 4 is a drawing depicting a partial front perspective view of an embodiment of a distributor assembly.

FIG. 4 depicts a partial front perspective view of a portion of a distributor assembly. Substrate 14 travels in direction 15 beneath vapor feed stream source 22 and redirector 26. Vapor feed stream source 22 can be substantially rectangular, or boat shaped, as depicted in FIG. 4. Vapor feed stream source 22 can span continuously, substantially the entire width of substrate 14, perpendicular to the direction of travel 15. As a result, vapor feed stream 25 can be directed by redirector 26 to deposit a film along substantially the entire width of substrate 14.

Figure 5:
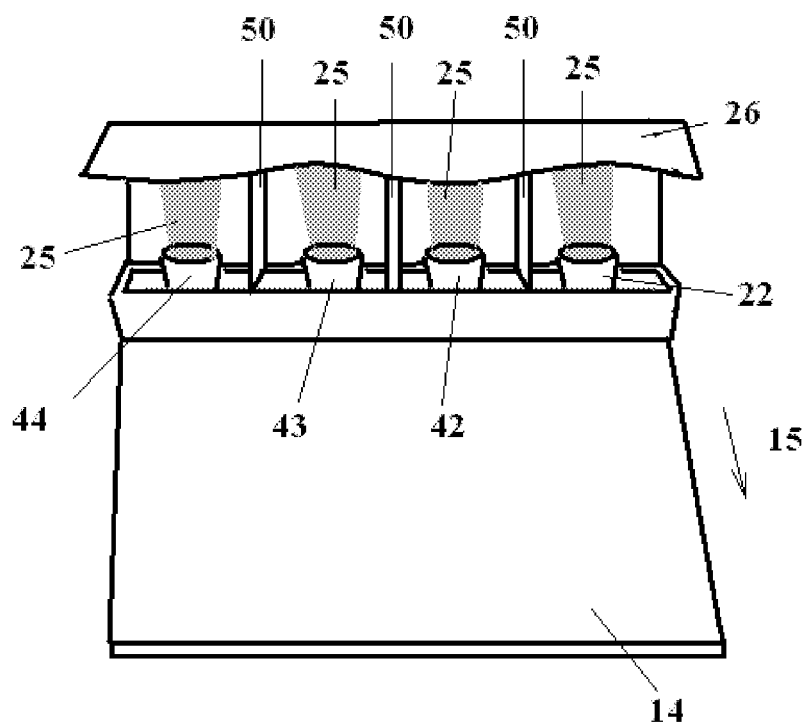
FIG. 5 is a drawing depicting a partial front perspective view of an additional embodiment of a distributor assembly.

Referring to FIG. 5, vapor feed stream source 22 can be substantially cylindrical in shape. Redirector 26 can be segmented. For example, redirector 26 can be segmented by ribs 50. Vapor feed stream source 22 can have a width that is a fraction of the entire width of substrate 14. Additional vapor feed stream sources, 42, 43, and 44 can be provided, and can be aligned with vapor feed stream source 22. Distinct vapor feed stream sources 22, 42, 43, and 44 can direct their respective vapor feed streams 25 toward redirector 26, which can be sufficiently wide to redirect vapor feed streams 25 to cover substantially the entire width of substrate 14 to deposit a film on a surface of substrate 14. Vapor feed stream sources 22, 42, 43 and 44 can be independently controllable for improved uniformity control of the deposition process and can be controlled independently for flow rate. For example, the direction in which vapor feed stream sources 22, 42, 43, and 44 direct vapor feed stream 25 can be independently controlled. Other known variables can be independently controlled in vapor feed stream sources 22, 42, 43, and 44 to optimize the deposition process.

Vapor feed stream source 42 can be positioned in any suitable location in the material deposition system. Vapor feed stream source 42 can be positioned below vapor feed stream source 22 such that the film deposition system can deposit multiple films on substrate 14. Referring to FIG. 2 and FIG. 3, second vapor feed stream source 42 (not shown) can be placed at the opposite side of redirector 26 from vapor feed stream source 22, in proximity to where vapor feed stream 25 is directed from vapor supply orifice 30. Thus, vapor feed stream source 42 can be a distance from vapor supply orifice 30 that is different from the distance from which vapor feed stream source 22 is positioned from vapor supply orifice 30.

The embodiments described above are offered by way of illustration and example. It should be understood that the examples provided above may be altered in certain respects and still remain within the scope of the claims. It should be appreciated that, while the invention has been described with reference to the above preferred embodiments, other embodiments are within the scope of the claims.

What is claimed is:

1. A material deposition system comprising:
   a first source of a vapor feed stream;
   a single vapor supply orifice directed toward a substrate position; and
   a redirector configured to transfer a mass of the vapor feed stream toward the vapor supply orifice and on to all or any portion of a substrate.

2. The material deposition system of claim 1, further comprising a lower redirector positioned to isolate the vapor feed stream from the substrate position.

3. The material deposition system of claim 1, further comprising a chamber wall containing the source and the redirector.

4. The material deposition system of claim 1, wherein the source is a vapor boat.

5. The material deposition system of claim 1, wherein the source is rectangular.

6. The material deposition system of claim 1, wherein the source is cylindrical.

7. The material deposition system of claim 1, further comprising a second source of a vapor feed stream.

8. The material deposition system of claim 1, wherein the source is configured to contain a vaporizable material.

9. The material deposition system of claim 8, wherein the vaporizable material includes a liquid.

10. The material deposition system of claim 8, wherein the vaporizable material includes a solid.

11. The material deposition system of claim 8, further comprising an electron-beam source configured to evaporate the vaporizable material to form the vapor feed stream.

12. The material deposition system of claim 8, further comprising a heater capable of thermal evaporating the vaporizable material to form the vapor feed stream.

13. The material deposition system of claim 1, wherein the source is connected to a continuous material feed source.

14. The material deposition system of claim 10, wherein the continuous material feed source is a feed wire.

15. The material deposition system of claim 1, wherein the redirector is curved.

16. The material deposition system of claim 1, wherein the redirector comprises a plurality of planar sections.

17. The material deposition system of claim 1, wherein the redirector shapes the vapor feed stream into a vapor plume having a central angle, the vapor plume expanding in the direction of the substrate position.

18. The material deposition system of claim 17, wherein the central angle is approximately perpendicular to the substrate position.

19. The material deposition system of claim 1, wherein the redirector is configured to direct the vapor feed stream into a plurality of vapor plumes directed toward a respective plurality of positions on the substrate position.

20. The material deposition system of claim 1, wherein the redirector is heated.

21. The material deposition system of claim 20, wherein the redirector is heated directly.

22. The material deposition system of claim 20, wherein the redirector is heated indirectly.

23. The material deposition system of claim 1, wherein the redirector comprises metal.

24. The material deposition system of claim 1, wherein the redirector comprises ceramic.

25. The material deposition system of claim 24, wherein the ceramic is selected from the group consisting of silicon carbide, pyrolytic boron nitride, graphite, and pyrolytic boron nitride-coated graphite.

26. The material deposition system of claim 1, wherein the redirector is segmented across its width.

27. The material deposition system of claim 26, further comprising ribs segmenting the redirector across its width.

28. The material deposition system of claim 1, wherein the redirector comprises an asymmetrical cross-section, such that the vapor feed stream is directed away from the source.

29. The material deposition system of claim 28, further comprising an electrical connection proximate to the source, such that the vapor feed stream is directed away from the electrical connection.

30. The material deposition system of claim 1, further comprising an observation aperture formed in the redirector for use in observing the system.

31. The material deposition system of claim 30, wherein the observation aperture is used for low-rate flux measurement.

32. The material deposition system of claim 30, further comprising electronic instrumentation for use in observing the system.

33. The material deposition system of claim 32, wherein the electronic instrumentation comprises electron impact emission spectroscopy instrumentation.

34. The material deposition system of claim 33, wherein the electronic instrumentation comprises quartz crystal microbalance instrumentation.

35. The material deposition system of claim 7, wherein the source and the second source are independently controllable.

36. The material deposition system of claim 7, wherein the second source is a distance from the vapor supply orifice unequal to the distance between the source and the vapor supply orifice.

37. The material deposition system of claim 2, further comprising a second source of vapor feed stream.

38. The material deposition system of claim 37, wherein the second source of vapor feed stream is disposed at a distance from the vapor supply orifice which is different from the distance between the first source of vapor feed stream and the vapor supply orifice.

39. The material deposition system of claim 7, wherein the second source of vapor feed stream is positioned below the source of vapor feed stream, such that the system can deposit multiple films on a substrate.

40. A system for depositing a film on a substrate, comprising:
   a material deposition system comprising a first vapor feed stream source positioned above a substrate position, wherein the vapor feed stream source is configured to direct at least one mass of a vapor feed stream in a direction away from the substrate position, the direction being non-parallel to at least one surface of a substrate occupying the substrate position;
   a redirector configured to change the direction of the at least one mass of the vapor feed stream, from a direction away from the substrate position to a direction toward the substrate position, and on to all or any portion of the substrate; and
   a conveyor for transporting the substrate into the substrate position.

41. The system of claim 40, further comprising a lower redirector positioned to isolate the vapor feed stream from the substrate position and toward the redirector.

42. The system of claim 40, further comprising a chamber wall containing the source and the redirector.

43. The system of claim 40, wherein the source is a vapor boat.

44. The system of claim 40, wherein the source is rectangular.

45. The system of claim 40, wherein the source is cylindrical.

46. The system of claim 40, further comprising a second source of a vapor feed stream.

47. The system of claim 40, wherein the source is configured to contain a vaporizable material.

48. The system of claim 47, wherein the vaporizable material includes a liquid.

49. The system of claim 47, wherein the vaporizable material includes a solid.

50. The system of claim 47, further comprising an electron-beam source configured to evaporate the vaporizable material to form the vapor feed stream.

51. The system of claim 47, further comprising a heater capable of thermal evaporating the vaporizable material to form the vapor feed stream.

52. The system of claim 40, wherein the source is connected to a continuous material feed source.

53. The system of claim 52, wherein the continuous material feed source is a feed wire.

54. The system of claim 40, wherein the redirector is curved.

55. The system of claim 40, wherein the redirector comprises a plurality of planar sections.

56. The system of claim 40, wherein the redirector shapes the vapor feed stream into a vapor plume having a central angle, the vapor plume expanding in the direction of the substrate position.

57. The system of claim 56, wherein the central angle is approximately perpendicular to the substrate position.

58. The system of claim 40, wherein the redirector is configured to direct the vapor feed stream into a plurality of vapor plumes directed toward a respective plurality of positions on the substrate position.

59. The system of claim 40, wherein the redirector is heated.

60. The system of claim 59, wherein the redirector is heated directly.

61. The system of claim 59, wherein the redirector is heated indirectly.

62. The system of claim 40, wherein the redirector comprises metal.

63. The system of claim 40, wherein the redirector comprises ceramic.

64. The system of claim 63, wherein the ceramic is selected from the group consisting of silicon carbide, pyrolytic boron nitride, graphite, and pyrolytic boron nitride-coated graphite.

65. The system of claim 40, wherein the redirector is segmented across its width.

66. The system of claim 65, further comprising ribs segmenting the redirector across its width.

67. The material deposition system of claim 40, wherein the redirector comprises an asymmetrical cross-section, such that the vapor feed stream is directed away from the source.

68. The material deposition system of claim 67, further comprising an electrical connection proximate to the source, such that the vapor feed stream is directed away from the electrical connection.

69. The material deposition system of claim 40, further comprising an observation aperture formed in the redirector for use in observing the system.

70. The material deposition system of claim 69, wherein the observation aperture is used for low-rate flux measurement.

71. The material deposition system of claim 69, further comprising electronic instrumentation for use in observing the system.

72. The material deposition system of claim 71, wherein the electronic instrumentation comprises electron impact emission spectroscopy instrumentation.

73. The material deposition system of claim 72, wherein the electronic instrumentation comprises quartz crystal microbalance instrumentation.

74. The material deposition system of claim 46, wherein the first source and the second source are independently controllable.

75. The material deposition system of claim 46, wherein the second source is a distance from the vapor supply orifice unequal to the distance between the first source and the vapor supply orifice.

76. The material deposition system of claim 41, further comprising a second source of vapor feed stream.

77. The material deposition system of claim 76, wherein the second source of vapor feed stream is disposed at a distance from the vapor supply orifice which is different from the distance between the first source of vapor feed stream and the vapor supply orifice.

78. The material deposition system of claim 46, wherein the second source of vapor feed stream is positioned below the first source of vapor feed stream, such that the system can deposit multiple films on a substrate.

79. A material deposition system comprising:
   a source of a vapor feed stream;
   a vapor supply orifice directed toward a substrate position; and
   a redirector configured to direct the vapor feed stream toward the vapor supply orifice and deposit the vapor feed stream at a plurality of different angles, simultaneously, on to all or any portion of a substrate occupying the substrate position, wherein the redirector comprises an asymmetrical cross-section such that the vapor feed stream is directed away from the source.

* * * * *